United States Patent
Perner

(10) Patent No.: US 6,462,388 B1
(45) Date of Patent: Oct. 8, 2002

(54) ISOLATION OF MEMORY CELLS IN CROSS POINT ARRAYS

(75) Inventor: Frederick A. Perner, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/912,565

(22) Filed: Jul. 26, 2001

(51) Int. Cl.[7] .............................................. H01L 29/76
(52) U.S. Cl. ...................... 257/390; 257/209; 257/262
(58) Field of Search ................................ 257/208, 209, 257/262, 390

(56) References Cited

U.S. PATENT DOCUMENTS

| | | | | |
|---|---|---|---|---|
| 5,051,796 A | * | 9/1991 | Gill ............................. 257/390 |
| 5,648,662 A | | 7/1997 | Zhang et al. ................. 257/59 |
| 5,681,759 A | | 10/1997 | Zhang ......................... 437/21 |
| 5,693,955 A | | 12/1997 | Goronkin et al. ............. 257/25 |
| 5,751,012 A | * | 5/1998 | Wolstenholme et al. .... 257/206 |
| 5,838,608 A | | 11/1998 | Zhu et al. .................... 365/158 |
| 5,991,193 A | | 11/1999 | Gallagher et al. .......... 365/171 |
| 6,097,625 A | | 8/2000 | Scheuerlein ................ 365/171 |
| 6,165,803 A | | 12/2000 | Chen et al. .................... 438/3 |
| 6,174,737 B1 | | 1/2001 | Durlam et al. ................. 438/3 |
| 6,180,444 B1 | | 1/2001 | Gates et al. ................ 438/237 |

OTHER PUBLICATIONS

"Vertical MOS–gated pin–diodes: MOS–gated tunneling transistors in Si(100) and Si(111)", by J. Schulze, C. Fink, T. Sulima, I. Eisele, and W. Hansch, Thin Solid Films 380, pp. 154–157.

* cited by examiner

Primary Examiner—Gene M. Munson

(57) ABSTRACT

A memory array includes memory cells located at cross points of first and second conductors. The memory cells are compound structures that are capable of storing data, and of isolating the memory cells from sneak path currents. The memory cells include tunnel gate surface effect transistors having non-uniform gate oxides. The gate oxides are supported on pillar diode structures. A memory cell stores a binary state in a tunnel junction of the gate oxide. In addition, a control gate of the transistor disconnects the tunnel junction from sidewalls of the pillar, preventing current flow. The control gate therefore prevents sneak path currents through the memory cell. The isolation features in the memory cells do not require space on the substrate, allowing for a high array density. In addition, the memory cells have a low forward voltage drop, improving the readability of the memory array.

19 Claims, 6 Drawing Sheets

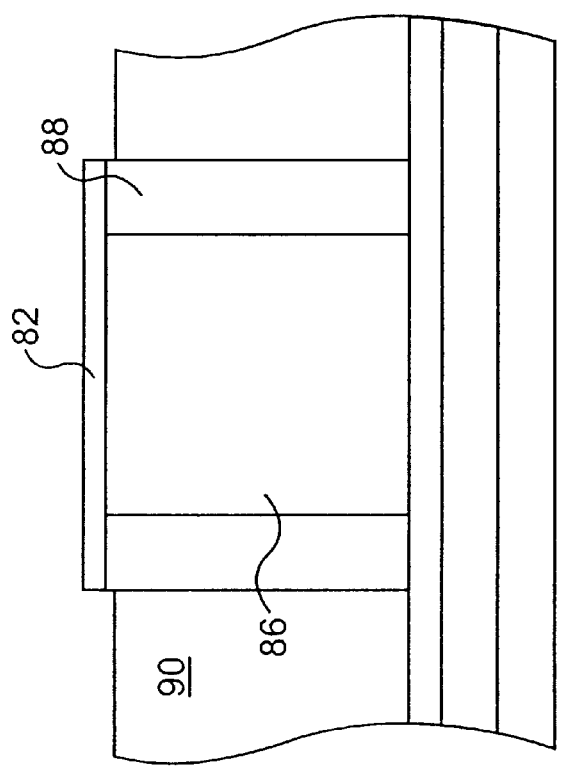
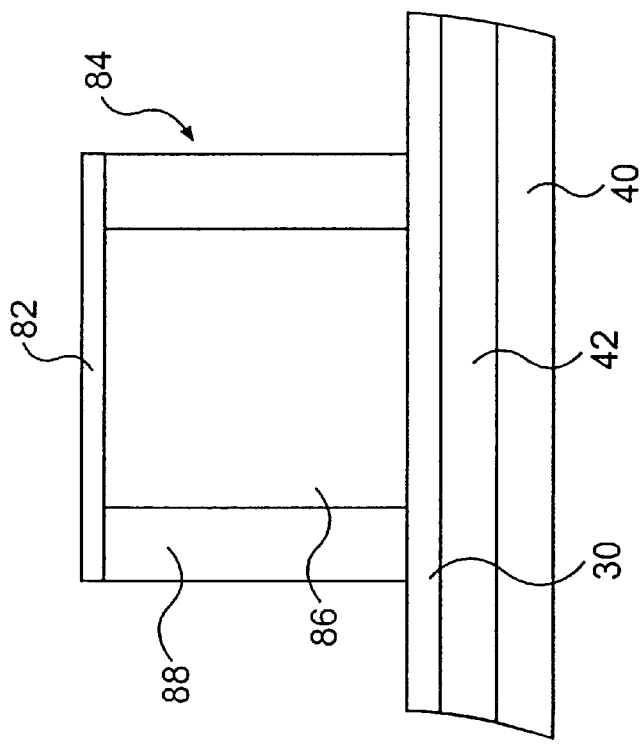

ISOLATION OF MEMORY CELLS IN CROSS POINT ARRAYS

TECHNICAL FIELD

The technical field is memory cells for cross point memory arrays. More specifically, the technical field is memory cells having an isolation feature built into the memory cells.

BACKGROUND

Cross point memory arrays include horizontal word lines that cross vertical bit lines. Memory cells are located at the cross points of the word and bit lines, and function as the storage elements of a memory array. The memory cells each store a binary state of either "1" or "0." A selected memory cell can have its binary state changed by applying write currents to the word line and the bit line that cross at the selected memory cell. The binary state of a selected memory cell is read by applying a read voltage to the memory cell, and by measuring the resistance across the memory cell from the current passing through the memory cell.

A cross point memory array may have all memory cells connected together as one large parallel circuit. Ideally, current passes only through a selected memory cell during a read operation. However, in a large parallel circuit memory array, currents flow through unselected memory elements during read operations. These currents are referred to as "sneak path currents." If the cross point memory array has a high density of memory cells, neighboring memory cells must be isolated from one another so that a selected memory cell is not affected by sneak path currents during a read operation.

Conventional parallel-connected cross point arrays include a control device in series with each memory cell to prevent sneak path currents. One conventional control device is a series MOS transistor located in a memory cell. The series MOS transistor is controlled by the word line connected to the memory cell. The series MOS transistor isolates the selected memory cell from unselected memory cells in the memory array by breaking parallel connections of memory cells. During read operations, only the MOS transistor in the selected memory cell is turned on. The MOS transistors in unselected cells are turned off, thereby preventing sneak path currents from flowing through unselected memory cells.

A disadvantage to MOS transistors is that they consume valuable substrate area, and the memory cells must be larger in order to accommodate electrical contacts from the memory cell to the substrate.

Another way to prevent sneak path currents is to place a series diode in a substrate of a memory array, or in plane with the memory cells of the memory array. This isolates the memory cells, but the associated diode forward voltage drops are large. A large forward voltage drop negatively affects the ability to read and write data in the memory cells.

A need therefore exists for an isolation feature for a memory cell that does not occupy substrate area, and that does not negatively affect the ability to read or write the memory cell

SUMMARY

According to a first aspect, a memory array includes memory cells located at cross points of first and second conductors. The memory cells are compound structures that are capable of storing data, and of isolating the memory cells from sneak path currents.

The memory cells include tunnel gate surface effect transistors having non-uniform gate oxides. The gate oxides are supported on pillar diode structures. A memory cell stores a binary state in a tunnel junction of the gate oxide. In addition, a control gate of the transistor disconnects the tunnel junction from sidewalls of the pillar, preventing current flow through the memory cell. The control gate therefore prevents sneak path currents through the memory cell.

According to the first aspect, the gate oxide provides an isolation feature to a memory cell that does not require space on the substrate. This allows more memory cells to be placed on the substrate, increasing array density.

In addition, the memory cells have a low forward voltage drop. Low forward voltage drops enhance the ability to sense the binary states of the memory cells, improving the ability to read the memory array.

Other aspects and advantages will become apparent from the following detailed description, taken in conjunction with the accompanying figures.

BRIEF DESCRIPTION OF THE FIGURES

The detailed description will refer to the following figures wherein like reference numerals refer to like elements and wherein:

FIGS. 5A–5D illustrate a method of making the cross point memory array illustrated in FIG. 3.

DETAILED DESCRIPTION

A memory array and memory cells for use in the memory array will be discussed by way of preferred embodiments and by way of the figures.

Figure 1:
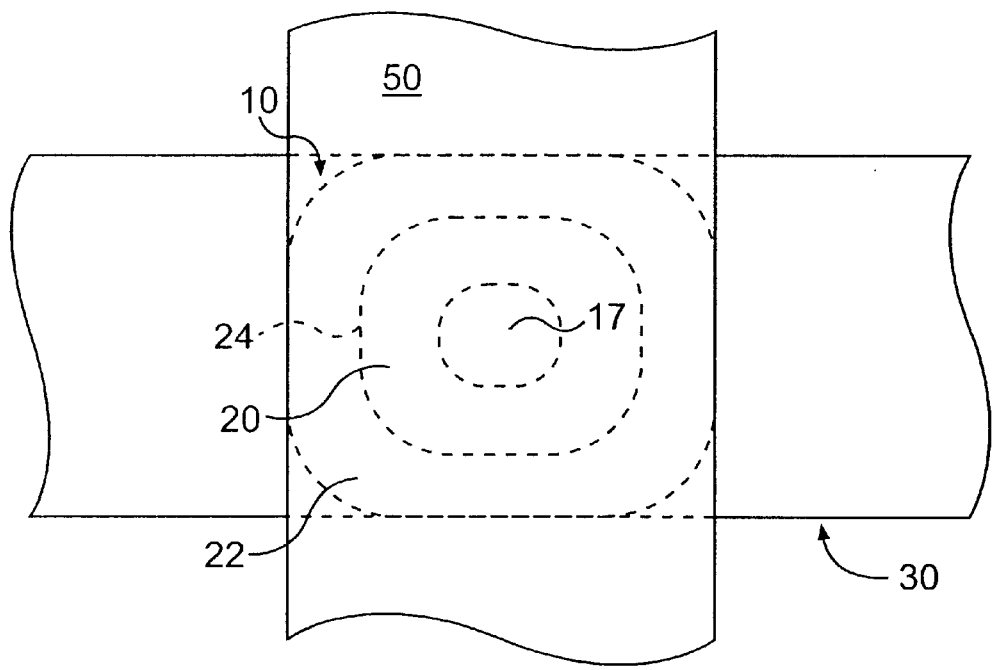
FIG. 1 is a top plan view of an embodiment of a memory cell located at a cross point of a first and a second conductor.
Figure 2:
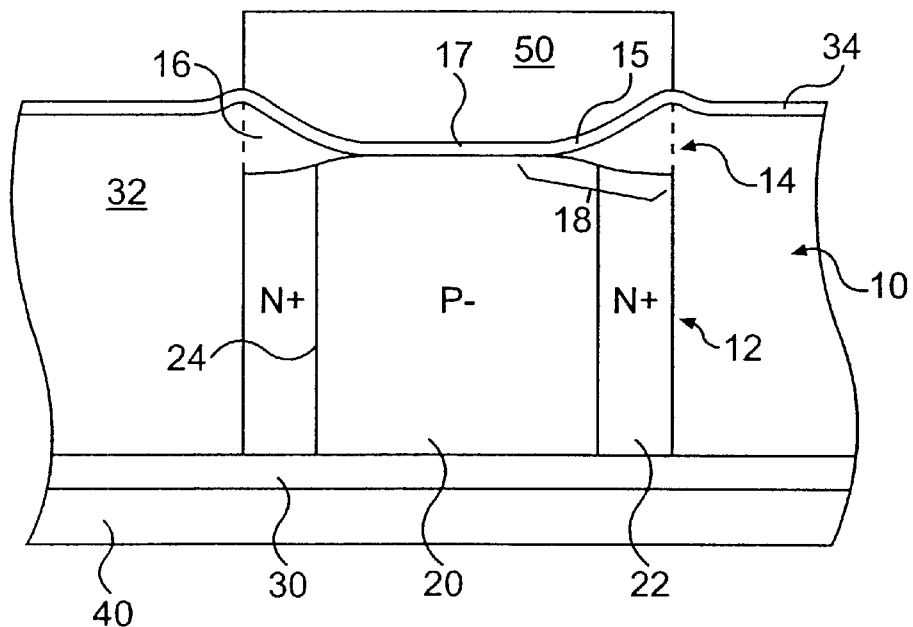
FIG. 2 is a side elevational view of the memory cell illustrated in FIG. 1, including the structure surrounding the memory cell in a cross point memory array.

FIG. 1 is a top plan view of a memory cell 10 located at a cross point of a first conductor 30 and a second conductor 50. FIG. 2 is a side elevational view of the memory cell 10, and the structure surrounding the memory cell 10 in a cross point memory array. The memory cell 10 comprises a pillar 12 and a gate oxide 14. The memory cell 10 is supported on a first conductor 30, and the first conductor 30 is supported on a substrate 40. A second conductor 50 is coupled to the gate oxide 14, and extends orthogonally to the first conductor 30.

Figure 3:
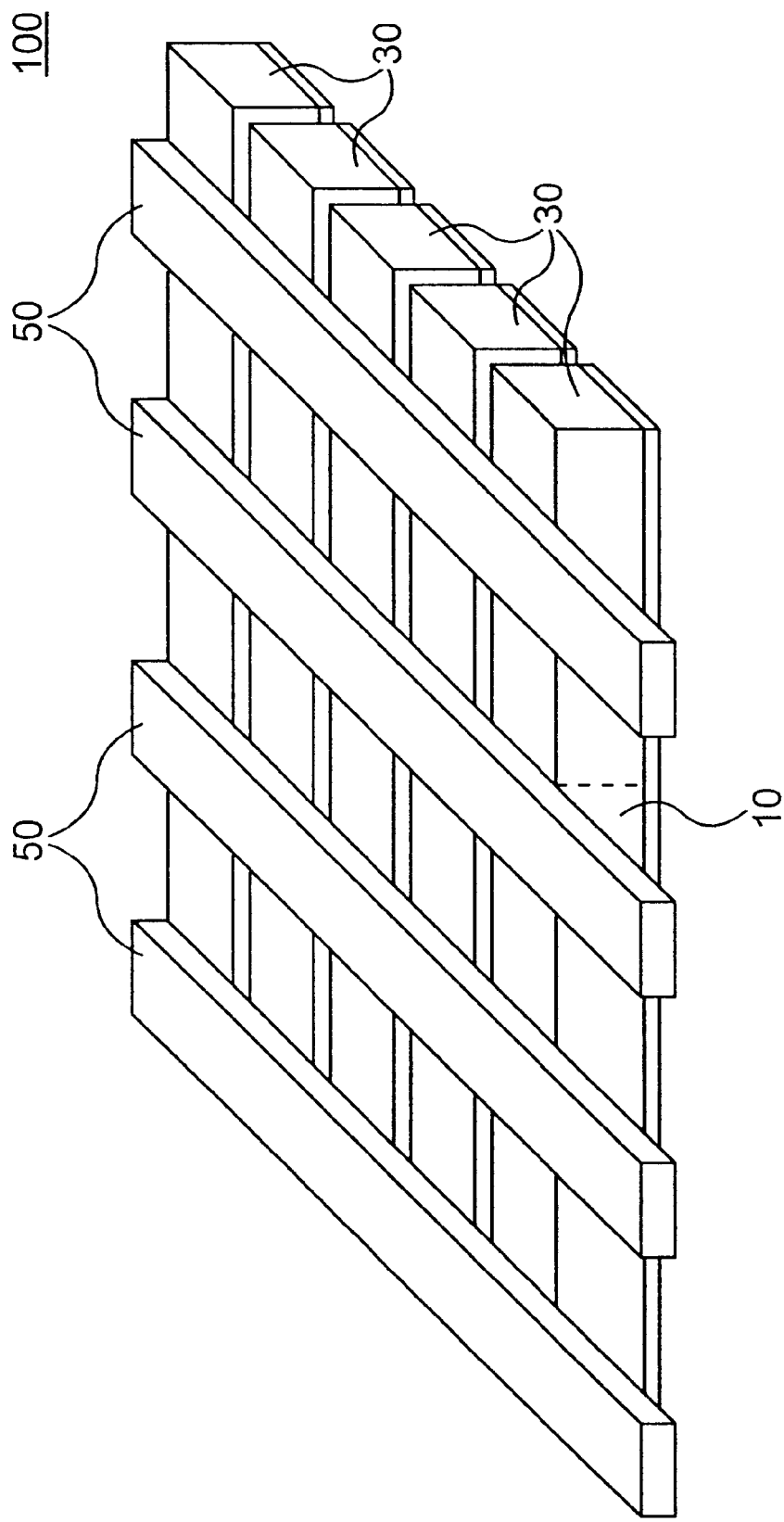
FIG. 3 is a perspective view of a cross point memory array including a plurality of memory cells as illustrated in FIG. 1.

FIG. 3 illustrates an array 100 of the memory cells 10. The memory cells 10 are located at the crossing points of first and second conductors 30, 50. The first conductors 30 and the second conductors 50 convey currents for changing the binary state of the memory cells 10 during write operations, and for reading the binary state of the memory cells 10 during read operations. The memory cells 10 may be, for example, "write once memory" (WOM) cells, where the conducting state of a tunnel oxide in the memory cell 10 is altered by applied voltages during write operations.

Referring again to FIG. 2, the pillar 12 is embedded in an insulator 32. The insulator 32 extends along the length of the first conductor 30. The insulator 32 surrounds each pillar 12 of the memory array 100. A thin tunnel junction (TTJ) layer 34 is formed on an upper surface of the insulator 32, and also extends along the length of the first conductor 30 and over the extent of the memory array 100.

The TTJ layers 34 in the memory array 100 control a tunnel current from the second conductor 50 to the surface of the pillar 12 in the memory cells 10. As shown in FIG. 2, the TTJ layer 34 may extend beyond the edges of the pillar 12. Between pillars 12, it rests on top of the insulator layer 32. There is no lateral conduction in the TTJ layer 34. In the vertical direction, the TTJ layer 34 provides additional insulation to the insulator layer 32, to insulate the second conductor 50 from the first conductor 30. The insulator 32 may be, for example, silicon dioxide ($SiO_2$), or polymide. The TTJ layer 34 may be, for example, alumina (aluminum oxide, $Al_2O_3$), $SiO_2$, or other oxides.

The gate oxide 14 corresponds to the volume between the pillar 12 and the second conductor 50, indicated by the dotted lines in FIG. 2. The gate oxide 14 has a nonuniform thickness, and comprises a tunnel gate oxide 15, and a non-uniform gate oxide 16. The nonuniform gate oxide 16 may be a $SiO_2$ gate oxide, for example. The tunnel gate oxide 15 is the portion of the TTJ layer 34 contacting the second conductor 50 and lying over the pillar 12. The central portion of the tunnel gate oxide 15 contacting the pillar 12 is a tunnel junction 17 for the gate oxide 14. For a write once memory cell 10, currents used to write to or to read the binary state of the memory cell 10 pass through the tunnel junction 17.

The outline of the tunnel junction 17 is illustrated by dotted lines in FIG. 1. The physical characteristics of the tunnel junction 17 may be changed by applying a write voltage across the memory cell 10. In this way, the tunnel junction 17 stores binary states of the memory cell 10.

In addition to acting as a storage medium for the memory cell 10, the gate oxide 14 functions as a control gate for a transistor. The transistor is actually comprised of elements of the memory array 100, and is represented symbolically in FIG. 4. The transistor and the storage and isolation functions of the gate oxide 14 are discussed in detail below with reference to FIG. 4.

Referring again to FIGS. 1 and 2, an outer region 18 of the gate oxide 14 has the shape of an annulus around the tunnel junction 17. The thickness of the outer region 18 increases outwardly from the tunnel junction 17 towards the outer edge of the gate oxide 14, and may appear to have a "bird's beak" cross section. The nonuniform gate oxide 16 forms the bird's beak between the pillar 12 and the tunnel gate oxide 15. The gate oxide 14 therefore has a non-uniform thickness that increases outwardly from the tunnel junction 17. The tunnel gate oxide 15 may have a relatively uniform thickness of, for example, between 7 and 15 Angstroms. The thickness of the gate oxide 14 may increase outwardly to between, for example, 15 and 100 Angstroms at the periphery of the gate oxide 14.

The pillar 12 includes a P− core region 20 and an N+ region 22 surrounding the P− core region 20. The pillar 12 therefore has a diode structure. The pillar 12 may have the shape of a generally rectangular post with rounded edges. A PN junction 24 is formed at the boundary between the N+ region 22 and the P− core region 20. The pillar 12 may also have, for example, a square or a round cross section. The cross section of the pillar 12 should be small enough so that the P− region 20 can be fully depleted with a zero voltage bias across the PN junction 24. The pillar 12 may be formed from, for example, a single crystal silicon grown from the substrate, an amorphous silicon post, or a polysilicon post. The center region of the pillar 12 is fully depleted, and the sidewalls may be doped with an N-dopant to form the N+ region 22.

Figure 4:
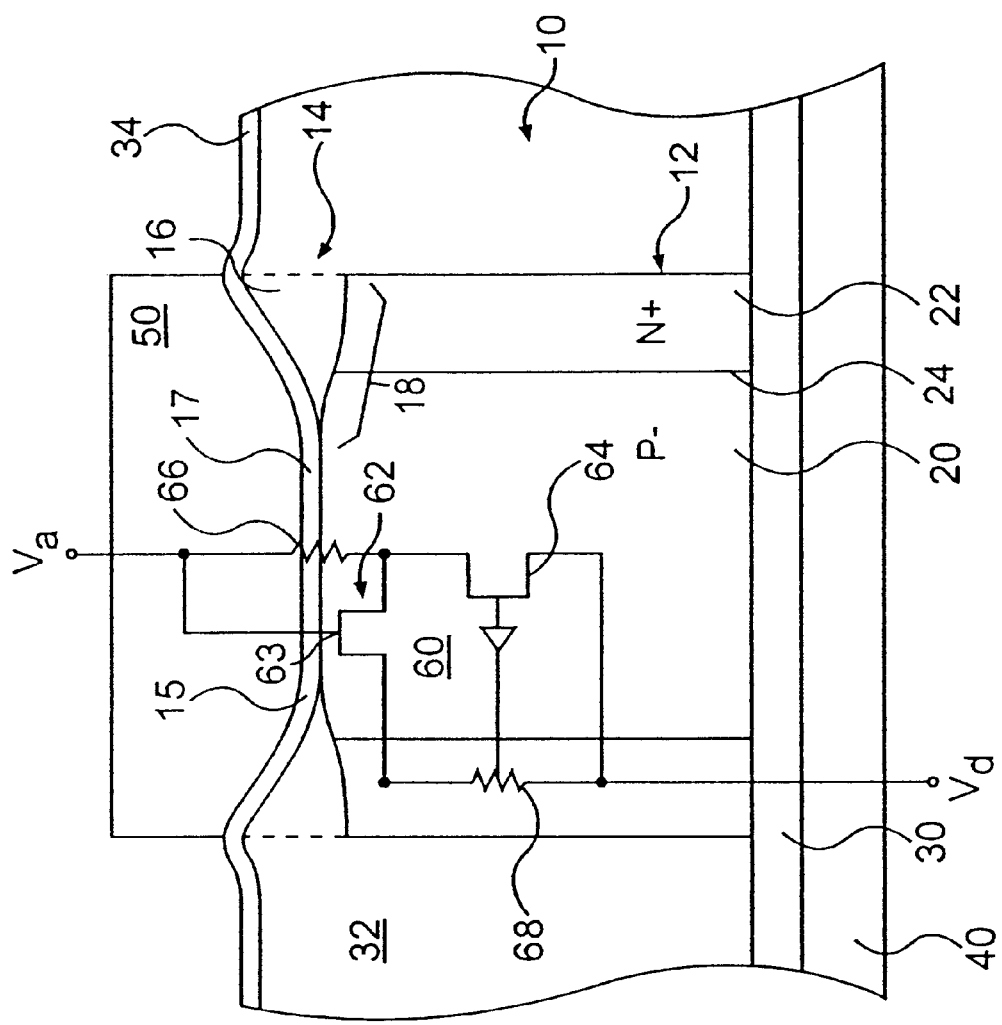
FIG. 4 is a side elevational view of the memory cell illustrated in FIG. 1 with an equivalent circuit superimposed on the memory cell.

FIG. 4 is a side elevational view of the memory cell 10 illustrated in FIGS. 1 and 2, with an equivalent circuit 60 superimposed thereon. According to one aspect of the memory cell 10, the memory cell 10 includes both a memory storage capability and an isolation capability. The equivalent circuit 60 is included in FIG. 4 to illustrate the storage and isolation capabilities of the memory cell 10.

In FIG. 4, the first conductor 30 is coupled to a voltage Vd, and the second conductor 50 is coupled to a voltage Va. The voltages Vd and Va represent voltages applied to the memory cell 10, and can be, for example, bit and word line voltages, respectively.

The equivalent circuit 60 is a symbolic representation of the functions of the various elements of the memory cell 10. The equivalent circuit 60 comprises an NMOS transistor 62, a JFET 64, a tunnel junction resistance 66, and an N+ region resistance 68. The surface of the pillar 12, along with a control gate 63 and the N+ region 22 at the periphery of the pillar 12, forms the NMOS transistor 62.

The gate oxide 14 (including the tunnel gate oxide 15 and the nonuniform oxide 16) corresponds to the control gate 63 of the NMOS transistor 62. The NMOS transistor control gate 63 can be generally referred to as "horizontally" oriented because current flows horizontally along the surface of the pillar 12 beneath the control gate 63, from the center of the pillar 12 to the edge of the pillar 12. The gate oxide 14 acts as a tunnel gate surface effect transistor.

The tunnel gate oxide 15 of the gate oxide 14 also corresponds to the drain of the NMOS transistor 62. There is no diffused drain region under the gate oxide 14, so the drain of the NMOS transistor 62 is a virtual drain at the center of the tunnel junction 17. The tunnel current through the tunnel gate oxide 15 injects current into a channel region of the NMOS transistor 62, as would a physical drain junction in a conventional NMOS transistor. The source of the NMOS transistor 62 is the N+ region 22 diffused about the surface of the pillar 12. A tunnel junction resistance 66 represents the resistance across the tunnel gate oxide 15.

The JFET 64 corresponds to the P− region 20 and the N+ region 22 of the pillar 12. The source of the JFET 64 corresponds to the electrical contact of the bottom of the P− region 20 with the first conductor 30. The drain of the JFET 64 corresponds to an NMOS channel region at the top of the P− region 20. The gate of the JFET 64 corresponds to the N+ diffused region 22. The JFET 64 can be generally referred to as "vertically" oriented, because the PN junction 24 extends perpendicularly to the surface of the substrate 40. The pillar 12 functions as a vertical enhancement mode JFET. The electrical connection of the JFET gate to the JFET source in the enhancement mode JFET maintains the P− region 20 depleted of carriers. An N+ region resistance 68 represents the resistance of the N+ region 22.

The equivalent circuit 60 will be used to describe the storage and isolation functions of the memory cell 10. The design of the JFET 64 is as an enhancement mode JFET, with a zero gate-to-source bias. The JFET 64 is in a non-conduction mode of operation. A non-conduction mode means that the P− region 20, or core region, of the JFET 64 is fully depleted. With the core of the pillar 12 fully depleted, current will flow through the tunnel junction resistance 66 only if the surface of the pillar 12 can be inverted (i.e., only if a conducting channel is formed). The surface of the pillar 12, along with the control gate 63 and the N+ region 22 at the periphery of the pillar 12, forms the NMOS transistor 62. The surface of the pillar 12 will become inverted if the voltage applied between the second conductor 50 and the first conductor 30 is greater than the threshold voltage of the NMOS transistor control gate 63.

If the voltage (Va) applied to the second conductor 50, relative to the first conductor 30, is greater than a threshold voltage (Vth) of the NMOS transistor control gate 63, an accumulation layer forms under the tunnel gate oxide 15. A tunnel current will flow through the tunnel junction 17 into the channel region (i.e., the accumulation layer) of the NMOS transistor control gate 63. The accumulation layer also connects the entire top surface of the pillar 12 to the N+ region 22 of the JFET 64. The result is a current that flows from the second conductor 50, through the tunnel gate oxide 15, laterally through the accumulation layer at the top of the P− region 20, and vertically through the N+ region 22 of the pillar 12 to the first conductor 30. The magnitude of the current depends on the magnitude of the applied voltage Va−Vd across the memory cell 10, and the effective resistance of the tunnel junction 17.

The gate oxide 14 is thin enough to ensure an accumulated layer forms on the top surface of the pillar 12, and thick enough to prevent a significant tunnel current through the outer region 18 of the gate oxide 14. Only the tunnel junction 17 is sufficiently thin enough to pass a sense current that depends on the binary state of the memory cell 10. The process of sensing data from the memory cell 10 is therefore focused at the tunnel junction 17 of the memory cell 10.

Advantageously, the memory cells 10 in the memory array 100 include a memory storage function and an isolation function. The memory cells 10 include tunnel gate surface effect transistors having non-uniform gate oxides 14. The transistors are supported on pillar diode structures. The tunnel junction 17 of the gate oxides 14 serve as the storage element for the memory cell 10. The NMOS and JFET features in the memory cells 10 provide the isolation feature to prevent sneak path currents through the memory array 100. The memory cell 10 is therefore a compound structure that combines the tunnel junction 17 storage element with an isolation feature. The resulting structure has a lower forward voltage drop than a memory element with a series diode control element. A lower forward voltage drop is advantageous because high voltage drops across memory cells degrade the ability to sense the resistance of the memory cells.

As another advantage, the memory cells 10 incorporate an isolation feature without consuming substrate area, unlike series MOS transistor control elements. This allows for higher array densities.

The memory cell 10 also has a high reverse resistance (lower reverse leakage current) because in a reverse mode, or "blocking" mode, the voltage (Va−Vd) applied to the memory cell 10 is less than the threshold voltage Vth of the NMOS transistor 62. When the gate voltage of an NMOS transistor 62 is less than the threshold voltage Vth, the channel of the NMOS transistor 62 remains inverted (i.e., not accumulated). And, when the channel is inverted, no current will flow from the drain to the source. Thus, the memory cell 10 has a high resistance when the applied voltage is less than the threshold voltage Vth.

A high reverse resistance is advantageous because in the reverse mode, the voltage (Va−Vd) applied to the memory cell 10 is less than the NMOS threshold voltage Vth. When Va−Vd is less than Vth, the top surface of the pillar 12 is not accumulated (remains depleted) and has a high resistance.

The conduction properties of the memory cell 10 are set according to the NMOS transistor 62 channel length and width, the mobility of electrons in the surface accumulation layer, and the threshold voltage Vth. In the memory cell 10, the channel length is the distance from the center of the pillar 12 to the PN junction 24 at the edge of the pillar 12. The reverse conduction parameters are primarily set by the threshold voltage Vth, and are superior to a horizontally arranged PN diode of similar size.

The reverse conduction parameters are superior because reverse leakage current in semiconductor devices is primarily determined by surface conduction, and a conventional PN diode requires special surface treatments that are impractical in a pillar vertical diode. By contrast, an NMOS device controls the conduction surface according to the gate voltage. The NMOS device therefore has an intrinsically lower leakage current.

PN diodes also have a heavily doped PN junction in order to achieve a low forward drop. Junctions formed from highly doped P and N regions have relatively large reverse leakage currents, greater than NMOS transistors.

The binary state of the tunnel junction 17 may be created by a reversible writing mechanism for a read/write memory, or by an irreversible mechanism for a write-once memory. The write processes could involve fuse or anti-fuse processes, phase change processes, electron trapping processes, and other write processes. The tunnel junction can store a first binary state (e.g. "0") prior to a writing operation, and can store a second binary state (e.g. "1") after a writing operation. The binary state of the memory cell 10 is detectable by a read operation.

The write operation for the memory cell 10 will be discussed with reference to FIGS. 3 and 4. In order to write to a memory cell 10, a memory cell 10 located at a particular row and column in the memory array 100 is first selected. A voltage Vd is applied at the first conductor 30 in the selected row, and a voltage Va is applied at the second conductor 50 in the selected column. The voltage Va−Vd is the write voltage applied to the memory cell 10 to change the physical properties of the tunnel junction 17. A high voltage stress to the tunnel junction 17 is maintained for a period of time sufficient to deliver enough energy to change the physical properties of the tunnel junction 17—which is the process of an anti-fuse. The write voltage breaks down the junction of the tunnel junction 17, and alters the resistance of the tunnel junction 17. The breakdown of the tunnel junction 17 can occur due to local heating, which causes the energy delivered to the junction to cause dopant atoms from either side of the tunnel junction 17 to permanently move into the tunnel junction region. This process alters the conduction parameters of the tunnel junction 17. After the anti-fuse write process, the resistance of the junction is lower than before the write operation.

Another breakdown mechanism for changing the conduction properties of the tunnel junction 17 is when electrons are caught in traps in the layer of the tunnel junction 17 due to an avalanche-multiplied current flow through the tunnel junction 17. This occurs when stress voltages exceed the breakdown voltage of the tunnel junction 17. The trapped electrons increase the threshold voltage of the NMOS transistor 62, changing its conduction properties. After the electron trapping write operation, the effective resistance of the tunnel junction 17 is higher than before the write operation.

The changing states of resistance of the tunnel junction 17 can be detected by a read operation as binary states of "1" and "0."

The conduction path during the write operation is through the NMOS transistor 62, through the N+ region 22, and also through the tunnel junction 17. The write voltage could be on the order of, for example, 1½ to 3 volts, for a period of between, for example, a tenth of a microsecond to a half-microsecond. The voltage Vd applied on the first conductor 30 should be large enough, i.e., Vd greater than Va, to ensure that unselected memory cells 10 on the row are not written to by the application of Vd. Similarly, the voltage Va applied on the second conductor 50 should be small enough so that unselected memory cells 10 on the column are not written to by the application of Va.

A read operation of the memory cell 10 will be discussed with reference to FIGS. 3 and 4. A read potential is applied to the second conductor 50 while the first conductor 30 is at ground. The current from the second conductor 50 to the first conductor 30 is measured to determine the resistance of the memory cell 10. From this resistance, the state of the memory cell 10 can be determined. A state of low resistance can be detected as a binary state of "0," while a state of high resistance can be detected as a binary state of "1." The read potential should be slightly positive.

The conduction of electrons through the tunnel junction 17 is described by probability functions. The probability for an electron to tunnel (i.e., pass directly through an insulator layer) is a function of the potentials at each side of the insulator, the thickness of the insulator, and the physical composition of the insulating layer (e.g, $SiO_2$, $Al_2O_3$). When a voltage is applied to the tunnel junction 17, a tunnel electron current flows through the tunnel junction 17 according to the probability function. The ratio of the applied voltage divided by the tunnel current is defined as the tunnel resistance. The tunnel current flows through the tunnel junction 17 when the NMOS transistor control gate 63 of the equivalent circuit 60 is turned ON.

The binary state of the memory cell 10 can be determined by detecting whether a high current or low current flows between the second conductor 50 and the first conductor 30. The magnitude of the current is determined by comparing the current to a set of reference devices or reference currents.

For unselected memory cells, the voltage difference between Va and Vd should be less than the threshold voltage Vth of the NMOS transistors in the unselected memory cells.

If the voltage applied to the second conductor 50 is less than the NMOS transistor threshold voltage Vth, the top surface of the pillar 12 will be depleted of carriers. The action of the NMOS transistor control gate 63 is to disconnect the tunnel junction resistance 66 at the virtual drain of the NMOS transistor 62 from the low resistance side walls of the NMOS transistor 62. This ensures that no reverse current flows through the memory cell 10.

Figure 5D:
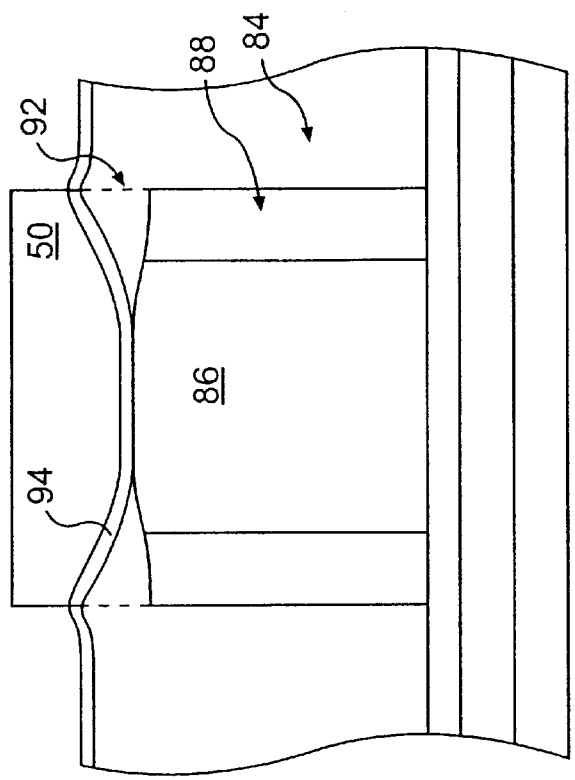

The memory cell 10 can be fabricated using a variety of processes. FIGS. 5A–5D present an exemplary fabrication process for the memory array 100 including memory cells 10. FIG. 6 is a flow chart illustrating a method of fabricating the memory array 100. The memory array 100 includes a plurality of memory cells 10, and the described fabrication process may be used to fabricate any of the memory cells 10 in the memory array 100. The memory cell 10 may be advantageously fabricated so that the memory cell 10 includes an integral storage element, i.e., the tunnel junction 17, and the control gate 63. The creation of the non-uniform gate oxide 14 enables these functions to be created on a pillar diode support structure.

Referring to FIGS. 5A and 6, the process begins with providing the substrate 40 in step S10. The substrate 40 may be, for example, silicon. The silicon substrate 40 can advantageously include support circuitry for memory circuitry to operate the memory array 100. This type of substrate 40 can be, for example, a CMOS integrated circuit. Other types of integrated circuits, such as bipolar, bi-CMOS, NMOS, and SOI circuits can be used. The substrate 40 may contain diffused patterns in a silicon substrate, MOS transistors, PN junction diodes, and polysilicon interconnect layers over inter-level oxide (SiO2) insulation layers. The substrate 40 may also include a layer 42 of silicon dioxide ($SiO_2$). The layer 42 of silicon dioxide may be formed by, for example, chemical vapor deposition (CVD). The layer 42 of silicon dioxide serves to insulate the first conductor 30 from top level conducting layers in the substrate 40, and to provide an insulator material that can be made planar using, for example, CMP (chemical-mechanical polishing) planarization.

In step S12, the first conductor 30 is deposited on the substrate 40. The first conductor 30 may be deposited by, for example, a CVD process. In step S14, the first conductor 30 is patterned by, for example, photolithography and polysilicon dry etching. The first conductor 30 may be, for example, polysilicon or amorphous silicon. The first conductor 30 may alternatively be formed as a diffused layer in the substrate 40.

In step S16, a layer of P– doped amorphous silicon is deposited over the entire substrate 40. The P– layer could also be, for example, polysilicon. The P– layer can be deposited by, for example, low pressure chemical vapor deposition (LPCVD).

In step S18, a thin barrier layer 82 is deposited over the P– layer. The barrier layer 82 should comprise a material that inhibits or prevents the diffusion of oxygen through the barrier layer. The barrier layer 82 may be, for example, silicon nitride ($Si_3N_4$).

In step S20, the barrier layer 82 is patterned by, for example, photolithography. The patterns may include, for example, squares aligned over memory cell locations on the first conductor 30, resulting in patterned areas of the barrier layer 82 covering each of the silicon pillars 84.

In step S21, the barrier layer 82 and the P– silicon layer are etched. The etching process leaves silicon pillars 84 on the substrate 40. Each of the silicon pillars 84 is capped with a barrier layer 82.

In step S22, an N+ dopant is diffused into the sidewalls of the silicon pillars 84. The doping process can be performed by placing the pillars 84 in an ambient gas rich in a dopant gas. The dopant gas may be, for example, arsenic gas, phosphorous gas, and other dopant gases. The diffusion process creates an N+ region 88 surrounding a P– core 86. The pillars 84 are selected to have a small enough cross section so that all of the mobile carriers are driven out of the pillars 84 by applying a contact potential. The contact potential causes mobile holes and electrons to cancel one another, ensuring fully depleted pillars 84.

The barrier layer caps 82 on the top of the pillars 84 are a barrier to the N+ deposition and diffusion process, preventing a PN junction from forming at the top of the pillars 84. FIG. 5A illustrates a pillar 84 after the doping step.

Referring to FIG. 5B, in step S24, the area on the substrate 40 between the pillars 84 is filled with an insulator 90 which may be, for example, silicon dioxide ($SiO_2$). The insulator 90 may be deposited by, for example, LPCVD. In step S26, the insulator 90 is etched back to a level just slightly below the level of the barrier layer 82, so that the edges of the barrier layer 82 and a portion of the N+ region are exposed. FIG. 5B illustrates the process after etching of the insulator 90.

Figure 5C:
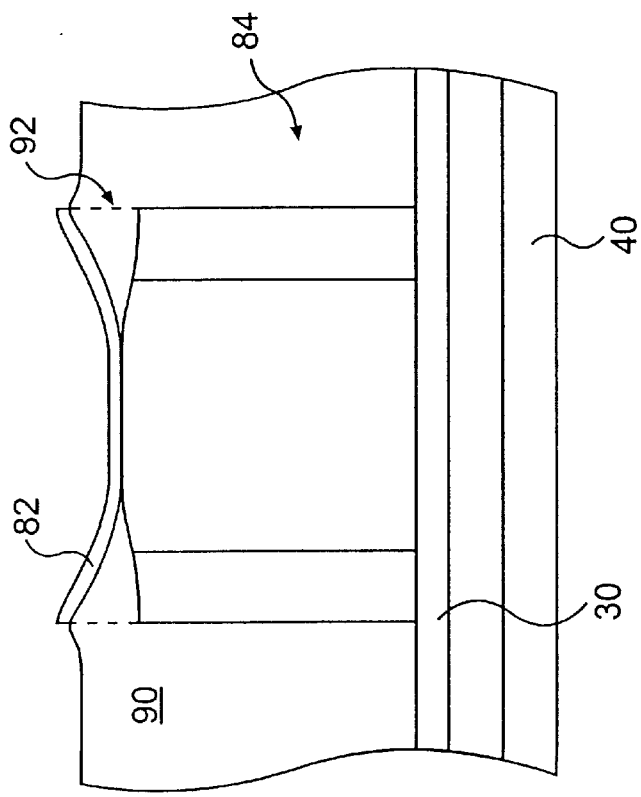
Figure 6:
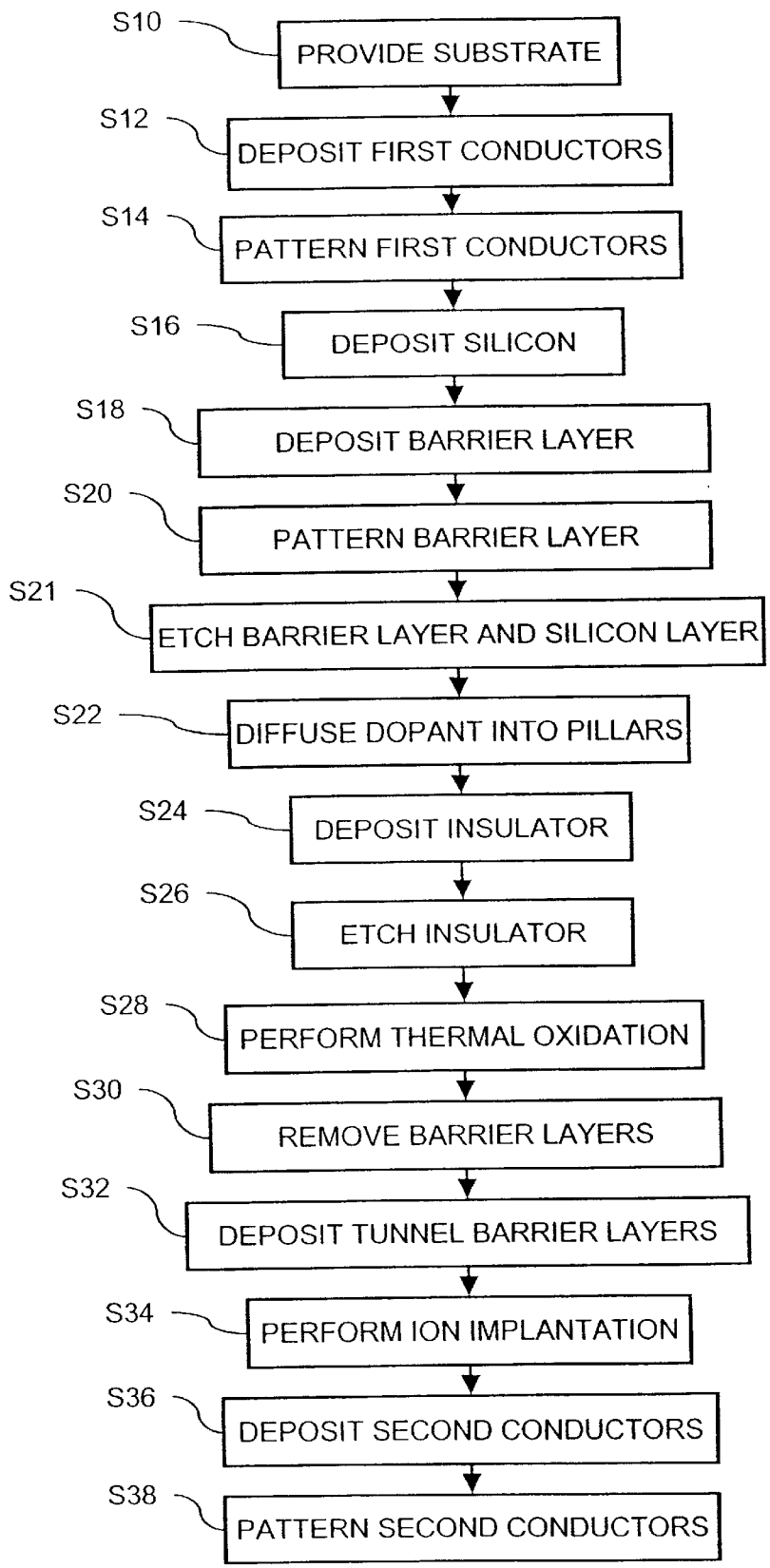
FIG. 6 is a flow chart illustrating a method of making the memory array.

Referring to FIG. 5C, in step S28, thermal oxidation is performed. During thermal oxidation, oxygen is placed in the ambient gas at an elevated temperature. During the oxidation process, oxygen diffuses through the insulator 90, to the silicon surface of the pillar 84. At the edge of the pillar 84, where the pillar 84 is exposed, the oxidation process occurs rapidly. The oxidation in the pillar 84 changes the silicon of the pillar 84 to silicon dioxide. The barrier layer 82 cap on top of the silicon pillar 84 is a barrier to oxygen and prevents oxidation at the top of the pillar 84. At the top edge of the pillar 84, oxygen diffuses under the barrier layer 82 and reacts with the silicon at the top surface of the pillar 84. This lateral diffusion and oxidation process is limited by the diffusion process, and slows down as it goes deeper into the pillar 84. As the silicon dioxide is formed, it pushes the barrier layer 82 upward. The result of the thermal oxidation process is a non-uniform silicon dioxide oxidation region 92 at the top of the pillar 84.

A cross section of the non-uniform oxidation region 92 is thick at the edge and very thin in the center, and the cross section is said to resemble a "bird's beak."

The oxidation of the silicon also lifts edges of the barrier layer 82 upward. FIG. 5C illustrates the fabrication process after thermal oxidation.

In step S30, the barrier layer 82 used to form the oxidation region 92 is removed by, for example, a wet dip in hot phosphoric acid. The wet dip can be performed without removing an excessive amount of the exposed oxidation region 92.

Referring to FIG. 5D, in step S32, a tunnel gate oxide 94 is deposited over the top of the oxidation region 92. The tunnel gate oxide 94 can be, for example, $SiO_2$, $Al_3O_2$, or other tunnel oxide materials. The tunnel gate oxide 94 can be deposited by, for example, depositing a thin layer of aluminum using a LPCVD process, followed by a brief exposure to oxygen to react with the aluminum to form $Al_3O_2$. The tunnel gate oxide 94 may also be grown by a short thermal oxidation in an oxygen rich ambient to form $SiO_2$. If the tunnel gate oxide 94 is of the same material, such as silicon dioxide, as the oxidation region 92, the two regions will be a continuous layer of silicon dioxide.

In step S34, ion implantation is performed on the oxidation region 92 and the tunnel gate oxide 94. Ion implantation is performed in order to create a desired threshold voltage Vth for the NMOS transistor control gate 63. Ion implantation is preferably performed using an arsenic species. A threshold voltage Vth of 0.5V, for example, can be used as the threshold voltage Vth.

The control region of the NMOS transistor 62 is the region of the pillar 84 nearest the PN junction between the N+ region 88 and the P– core 86, under the region where the oxidation region 92 varies from thick at the edge of the pillar 84 to very thin at the center of the pillar 84. The ion implantation forms a threshold adjust layer of, for example, arsenic, to a depth of about 0.05 μm in the pillar 84.

In step S36, the second conductor 50 is deposited over the tunnel gate oxide. In step S38, the second conductor 50 is patterned. The second conductor 50 can be, for example, aluminum, copper, or other conductors. A layer of polysilicon can also be used to form the second conductor 50. The deposition can be performed by, for example, chemical vapor deposition.

After the second conductor 50 is patterned, the memory array 100 as illustrated in FIG. 3, including memory cells 10 as illustrated in FIGS. 1 and 2, is completed.

The above fabrication process employs high temperature processing to diffuse N doping into the sidewalls of the pillar 84, and to grow a non-uniform gate oxide surface structure. A low temperature process may also be used, however. For example, the NP sidewall junction may be a low temperature Schottky junction. In this case, the nonuniform gate oxide surface structure may be constructed using a combination of ion milling, low temperature depositions, and CMP planarization.

The memory array 100 illustrated in FIG. 3 is compatible with a multi-plane memory structure. For example, a plurality of memory arrays 100 could be stacked. A multiplane memory structure could be formed by performing the fabrication steps recited in FIG. 6, and then forming an insulator layer over the finished memory array 100. A subsequent memory array 100 can then be formed over the insulator layer. This process can be repeated until a desired number of memory arrays are included in the memory structure.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations.

What is claimed is:

1. A memory cell, comprising:
   a P– region;
   an N+ region surrounding the P– region, the P– region and the N+ region forming a pillar; and
   a gate oxide disposed at one end of the pillar, the gate oxide including a portion capable of storing a binary state.

2. The memory cell of claim 1, wherein the gate oxide comprises:
   a tunnel gate oxide.

3. The memory cell of claim 2, wherein the portion of the gate oxide capable of storing a binary state is a tunnel junction, the tunnel junction contacting the P– region of the pillar.

4. The memory cell of claim 3, wherein a resistance across the tunnel junction can be changed in response to a write voltage, the change in resistance being readable as a change in the binary state of the tunnel junction.

5. The memory cell of claim 1, wherein the gate oxide has a non-uniform thickness.

6. The memory cell of claim 5, wherein a center portion of the gate oxide is the portion capable of storing a binary state.

7. The memory cell of claim 5, wherein the gate oxide has an annular cross section that increases towards an outer edge of the annulus.

8. The memory cell of claim 5, wherein the gate oxide functions as an NMOS transistor control gate.

9. The memory cell of claim 5, wherein a PN junction between the P– region and the N+ region extends through the pillar.

10. The memory cell of claim 9, wherein the pillar functions as a JFET in an OFF state.

11. A memory array, comprising:

a substrate;

a plurality of first conductors disposed on the substrate, each first conductor including an insulator formed over the first conductor;

a plurality of second conductors, the plurality of second conductors crossing the first conductors at a plurality of cross points; and a plurality of memory cells, each memory cell being disposed between a first and a second conductor at a cross point, and comprising:

a P− region disposed on a first conductor;

an N+ region surrounding the P− region, the P− region and the N+ region forming a pillar; and a gate oxide disposed between one end of the pillar and a second conductor, the gate oxide including a portion capable of storing a binary state.

12. The memory array of claim 11, wherein the gate oxide comprises:

a tunnel gate oxide.

13. The memory array of claim 12, wherein the portion of the gate oxide capable of storing a binary state is a tunnel junction, the tunnel junction contacting the P− region of the pillar.

14. The memory array of claim 13, wherein the gate oxide comprises:

a region of oxide between the pillar and the second conductor, wherein the region of oxide is continuous with an adjacent insulator.

15. The memory array of claim 14, wherein the region of oxide has a nonuniform annular shape.

16. The memory array of claim 13, wherein a resistance across the tunnel junction can be changed in response to a write voltage, the change in resistance being readable as a change in the binary state of the tunnel junction.

17. The memory array of claim 16, wherein the gate oxide has an annular cross section that increases towards an outer edge of the annulus.

18. The memory array of claim 16, wherein the gate oxide functions as an NMOS transistor.

19. The memory array of claim 16 wherein a PN junction between the P− region and the N+ region extends through the pillar.

* * * * *